United States Patent [19]

Mehta

[11] Patent Number: 5,319,522
[45] Date of Patent: Jun. 7, 1994

[54] ENCAPSULATED PRODUCT AND METHOD OF MANUFACTURE

[75] Inventor: Rajendra M. Mehta, Ypsilanti, Mich.

[73] Assignee: Ford Motor Company, Dearborn, Mich.

[21] Appl. No.: 992,331

[22] Filed: Dec. 17, 1992

[51] Int. Cl.$^5$ .............................................. H05K 1/00
[52] U.S. Cl. .................................. 361/748; 361/752; 361/761; 361/779; 174/52.2; 174/52.1; 257/787
[58] Field of Search ............... 361/380, 392, 395, 397, 361/399, 401, 402, 411, 707, 730, 748, 752, 750, 751, 761, 762, 779, 52.1; 174/52.2, 52.1, 52.3, 255, 260; 257/678, 787

[56] References Cited

U.S. PATENT DOCUMENTS

| | | | |
|---|---|---|---|
| 2,983,964 | 5/1961 | Vocht | 18/59 |
| 3,216,089 | 11/1965 | Dehman | 29/155.5 |
| 3,226,463 | 12/1965 | Wallace | 264/272 |
| 4,397,803 | 8/1983 | Hall, Jr. et al. | 264/272.15 |
| 4,528,419 | 7/1985 | Charlebois et al. | 174/88 |
| 4,582,388 | 4/1986 | Swaffield | 339/258 TC |
| 4,738,812 | 4/1988 | Raynal | 264/251 |
| 4,814,028 | 3/1989 | Sawaki et al. | 156/48 |
| 4,821,413 | 4/1989 | Schmitt et al. | 29/883 |
| 4,914,804 | 4/1990 | McElheny et al. | 29/602.1 |

FOREIGN PATENT DOCUMENTS 3276799 12/1991 Japan.

*Primary Examiner*—Leo P. Picard
*Assistant Examiner*—Young Whang
*Attorney, Agent, or Firm*—Roger May; Mark Mollon

[57] ABSTRACT

A method is provided for encapsulating an object with a heat-shrinkable material prior to subjecting the encapsulated object to insert, injection molding. The encapsulation protects the object from thermal damage by preventing contact with the injected polymer. In addition, the encapsulation protects the object from contact by any liquids or other foreign materials which penetrate the molded enclosure.

20 Claims, 2 Drawing Sheets

ENCAPSULATED PRODUCT AND METHOD OF MANUFACTURE

BACKGROUND OF THE INVENTION

The present invention relates to a method of protecting an object subjected to insert, injection molding by encasing the object in an encapsulating shell prior to subjecting the object to insert, injection molding. More particularly, it relates to encapsulating an object with a heat-shrinkable material prior to subjecting the object to insert, injection molding.

Insert, injection molding involves the insertion of an object into an injection mold and injecting a flowable polymer at high temperature and pressure into the mold to form a molded product of which the inserted object has become an integral part. Certain objects can be damaged when contacted by the high temperature, high pressure polymer as it is injected into the mold. For example, electrical or electronic devices, or combinations thereof in the form of a printed circuit board, are particularly susceptible to damage when subjected to insert, injection molding. Such devices may become instantly inoperative upon contact by molten polymer. Alternatively, thermal shock from direct exposure to molten polymer may produce latent damage, resulting in the premature failure of such parts. In addition, when the injected polymer is above the melt temperature of solder, any solder coming into contact with the polymer will melt. As a consequence, the electrical connection made by the melted solder can become disabled. Moreover, if the solder is only partially melted, the melted portion may flow with the molten polymer and make contact with an adjoining electrical or electronic component, thereby forming a conductive "bridge" between two components which should not be electrically joined.

Although electrical and electronic devices, as well as printed circuit boards, are susceptible to damage when subjected to insert, injection molding, in many instances it is highly desirable to do so nevertheless Insert, injection molding is done in order to provide a protective enclosure around such devices when used in operating environments which may subject the devices to physical abuses, such as jarring or frequent exposure to dirt and moisture. In an automotive vehicle, for instance, electrical devices, electronic devices, and printed circuit boards are often provided with a protective molded enclosure, particularly those which are exposed to automotive fluids, excess vibrations and jarring, or physical contact. Examples include temperature sensors, which are exposed to engine vibrations, continuous contact with oil, and high temperatures, and speed sensors, which are subjected to transmission vibrations, high temperatures, and exposure to transmission fluid.

An additional problem with insert, injection molded products is that the injection molded enclosure can allow liquids or other foreign materials to penetrate the molded enclosure and come into contact with the enclosed object. This can result from cracks in the enclosure as well as through openings intentionally left in the enclosure in order to access the enclosed object. In the case of electrical or electronic components, such liquid contact can result in damage or shorting.

As can be appreciated, means for protecting objects from damage when subjected to insert, injection molding, as well as for preventing contact by liquids which penetrate the molded enclosure, would be highly advantageous. U.S. Pat. No. 3,226,463 to Wallace discloses a dielectric sleeve which is placed around a circuit element as well as the bare wire connections of the circuit element with conductor leads. The circuit element with the sleeve therearound is placed in an injection mold and subjected to heated liquid plastic which is injected into the mold under pressure. However, the dielectric sleeve permits the heated liquid plastic to flow inside of the sleeve such that the heated liquid plastic directly contacts the circuit element and bare wire connections Thus, the circuit element, as well as the connections, is susceptible to thermal damage In addition, any solder used to make the connections is vulnerable to melting. Further, in use, any liquids which penetrate the solidified plastic will directly contact the circuit element and/or the connections.

Accordingly, it is seen that a need exists in the art for a method of protecting an object subjected to insert, injection molding from damage due to contact with the injected polymer, and for protecting the enclosed object from contact from foreign liquids or other materials which penetrate the molded enclosure.

SUMMARY OF THE INVENTION

That need is met by the present invention which provides a method of encapsulating an object with a heat-shrinkable material prior to subjecting the encapsulated object to insert, injection molding, and the product produced thereby. The encapsulation protects the object from thermal damage by minimizing direct contact of the object by the injected polymer. In addition, the encapsulation protects the object from being contacted by any liquids which may penetrate the molded enclosure.

In accordance with one aspect of the present invention, an encapsulated product is provided, comprising an object enclosed within a molded plastic material, and an encapsulating shell positioned around the object and interposed between the object and the molded plastic material such that the molded plastic material is substantially prevented from contacting the object. The encapsulating shell comprises a heat-shrinkable material which has been heat shrunk to encapsulate the object. Advantageously, the encapsulating shell substantially minimizes contact with the encapsulated object by any foreign liquid materials which may penetrate the outer plastic material In accordance with another aspect of the present invention, a method is provided of making an encapsulated product, comprising the steps of positioning a heat-shrinkable material around an object, applying sufficient heat to the heat-shrinkable material to activate the heat-shrinkable material such that the heat-shrinkable material substantially completely encapsulates the object, placing the encapsulated object in a mold having a cavity with a predetermined shape, adding a flowable polymer to the mold such that the encapsulated object is substantially completely surrounded by the flowable polymer, and solidifying the flowable polymer. Preferably, the mold is an insert, injection mold. Advantageously, the heat-shrinkable material substantially minimizes contact with the encapsulated object by the flowable polymer while the polymer is added to the mold. In this manner, the heat-shrinkable material protects the object from damage which may occur due to direct contact with the flowable polymer, which is injected into the mold under high pressure and at high temperature.

Accordingly, it is a feature of the present invention to provide an object encapsulated with an encapsulating shell and contained within an outer molded plastic enclosure.

It is a further feature to provide a method of encapsulating an object with a heat-shrinkable material prior to subjecting the encapsulated object to insert, injection molding.

These and other features and advantages of the present invention will become apparent from the following detailed description, the accompanying drawings, and the appended claims.

DETAILED DESCRIPTION OF THE PREFERRED EMBODIMENT

The present invention provides a method of making an encapsulated product which allows an object to be insert, injection molded without sustaining damage from direct contact with the injected polymer, and the product produced thereby. Generally, a heat-shrinkable material is first positioned around an object to be insert, injection molded. The object can be any object around which it is desired to place a molded plastic enclosure. The method of the present invention is particularly useful for objects which are susceptible to damage when subjected to insert, injection molding, or those which can be damaged upon contact with fluids or other foreign objects. After the heat-shrinkable material has been positioned around the object, sufficient heat is applied to the heat-shrinkable material to activate the heat-shrinkable material such that it substantially completely encapsulates the object within. The encapsulated object is then placed in a mold and a flowable polymer is added thereto such that the encapsulated object is substantially completely surrounded by the flowable polymer. Finally, the flowable polymer is solidified to complete the encapsulated product. In this manner, the heat-shrinkable material substantially prevents the flowable polymer from contacting the object while the polymer is added to the mold, thereby protecting the object from any damage which may occur due to direct contact with the flowable polymer.

By way of example, the method of the present invention will be illustrated by reference to FIGS. 1–6. It is to be understood, however, that the following example is set forth for illustration purposes only, and that the particular application of the present invention which is illustrated is not intended to be limiting.

Figure 1:
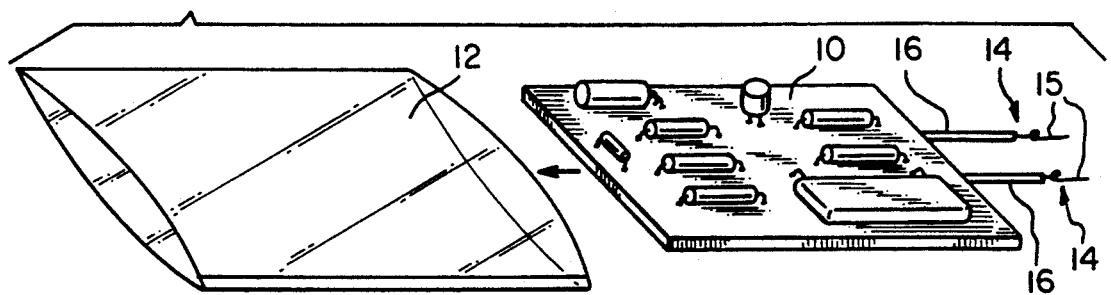
FIG. 1 a perspective view of a tube of a heat-shrinkable material about to be positioned around a printed circuit board.

With reference to FIG. 1, printed circuit board 10 and heat-shrinkable material 12 are shown. Heat-shrinkable material 12 is adapted to be positioned around printed circuit board 10. Preferably, heat-shrinkable material 12 is tubular or sleeve shaped so that it can be easily slipped around printed circuit board 10. Printed circuit board 10 includes a pair of electrical contact leads 14, both of which include a lead wire 15 surrounded by insulation 16. Electrical contact leads 14 provide a means for electrically communicating with printed circuit board 10.

Generally, printed circuit board 10 is an object around which it is desired to form a molded enclosure. Containing various electronic components electrically and mechanically joined by solder joints, printed circuit board 10 is an object which is susceptible to damage upon direct contact with a high-temperature, flowable polymer. Thus, printed circuit board 10 serves as a good example of an object for which the method of the present invention is useful. As can be readily appreciated however, any other object, such as an electrical or electronic device, may just as readily be utilized with the method of the present invention.

Figure 2:
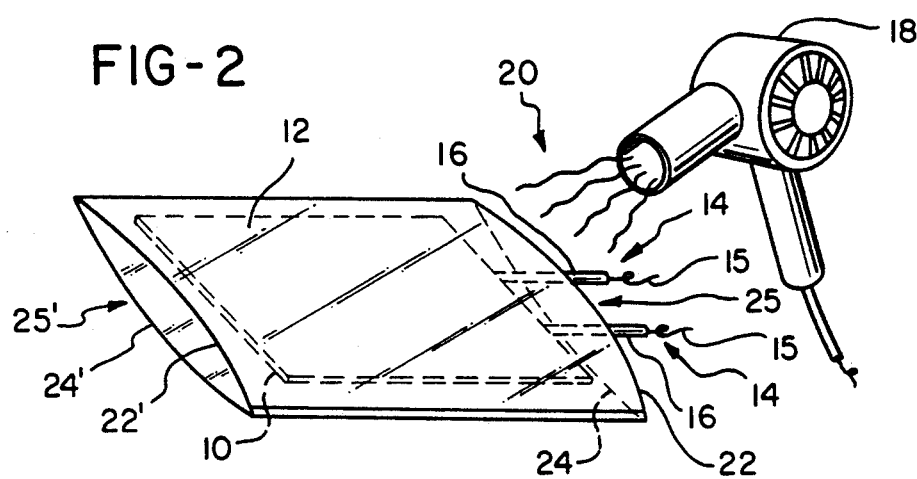
FIG. 2 is a perspective view of heat being applied to the tube of heat-shrinkable material of FIG. 1 in order to encapsulate the printed circuit board of FIG. I positioned therewithin.
Figure 3:
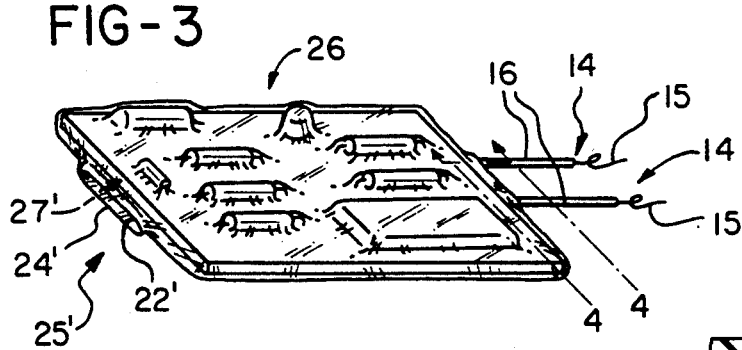
FIG. 3 is a perspective view of the printed circuit board of FIG. 2 encapsulated within the heat-shrinkable material of FIG. 2 after being heat shrunk.
Figure 4:
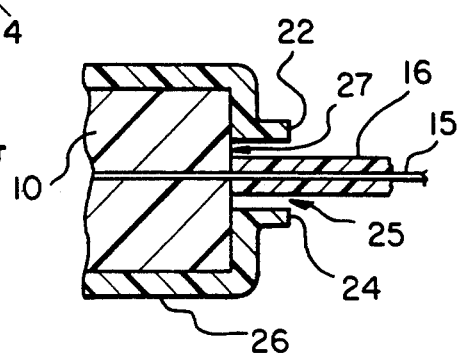
FIG. 4 is a cross-sectional view taken along lines 4—4 in FIG. 3.

Referring collectively to FIGS. 2–4, the encapsulation of printed circuit board 10 will be discussed. As shown in FIG. 2, heat-shrinkable material 12 is positioned around printed circuit board 10. Heat, sufficient to activate heat-shrinkable material 12, is then applied to heat-shrinkable material 12 by heat gun 18, or by any suitable heat source. By "activate," we mean that the temperature of the heated air 20 flowing onto heat-shrinkable material 12 from heat gun 18 is above the minimum temperature at which heat-shrinkable material 12 shrinks In this manner, when activated, heat-shrinkable material 12 will shrink around printed circuit board 10 to form encapsulating shell 26 which, as shown in FIG. 3, substantially completely encapsulates printed circuit board 10.

Preferably, upper edge 22 and lower edge 24 of heat-shrinkable material 12 are positioned around electrical contact leads 14 through opening 25 in heat-shrinkable material 12. As shown in FIGS. 3 and 4, when heat is applied to activate heat-shrinkable material 12, upper and lower edges 22 and 24, as well as opposing upper and lower edges 22, and 24,, converge such that openings 25 and 25' become substantially smaller in size than the size of those openings prior to the application of heat to heat-shrinkable material 12. In this manner, only minimal portions of the surface of printed circuit board 10 will be exposed to direct contact with flowable polymer during insert, injection molding. Specifically, only exposed portions 27 and 27' of printed circuit board 10 will be subjected to direct contact by flowable polymer entering openings 25 and 25', respectively.

In addition, encapsulating shell 26 substantially minimizes contact with the remaining portions of printed circuit board 10 which are not exposed to direct contact by flowable polymer during insert, injection molding. Heat-shrinkable material 12 is preferably sized such that, when activated, the resultant encapsulating shell 26 tightly conforms to the outer contour of printed circuit board 10. The tightly conforming shape of encapsulating shell 26 around printed circuit board 10 substantially prevents flowable polymer from flowing inside of encapsulated shell 26 to contact the portions of printed circuit board 10 which are not exposed to direct contact by flowable polymer during insert, injection molding. As shown in FIG. 4, few, if any, void spaces exist between encapsulating shell 26 and printed circuit board 10. Thus, flowable polymer which contacts exposed portions 27 and 27' of printed circuit board 10 is largely prevented from flowing between encapsulating shell 26 and printed circuit board 10 to reach the vital, non-exposed portions of printed circuit board 10. In the event that some flowable polymer does reach the non-exposed portions of printed circuit board 10, the flowable polymer reaching those non-exposed portions will have lost enough heat and will be so small in amount as to pose little or no threat of damage to printed circuit board 10.

Figure 5:
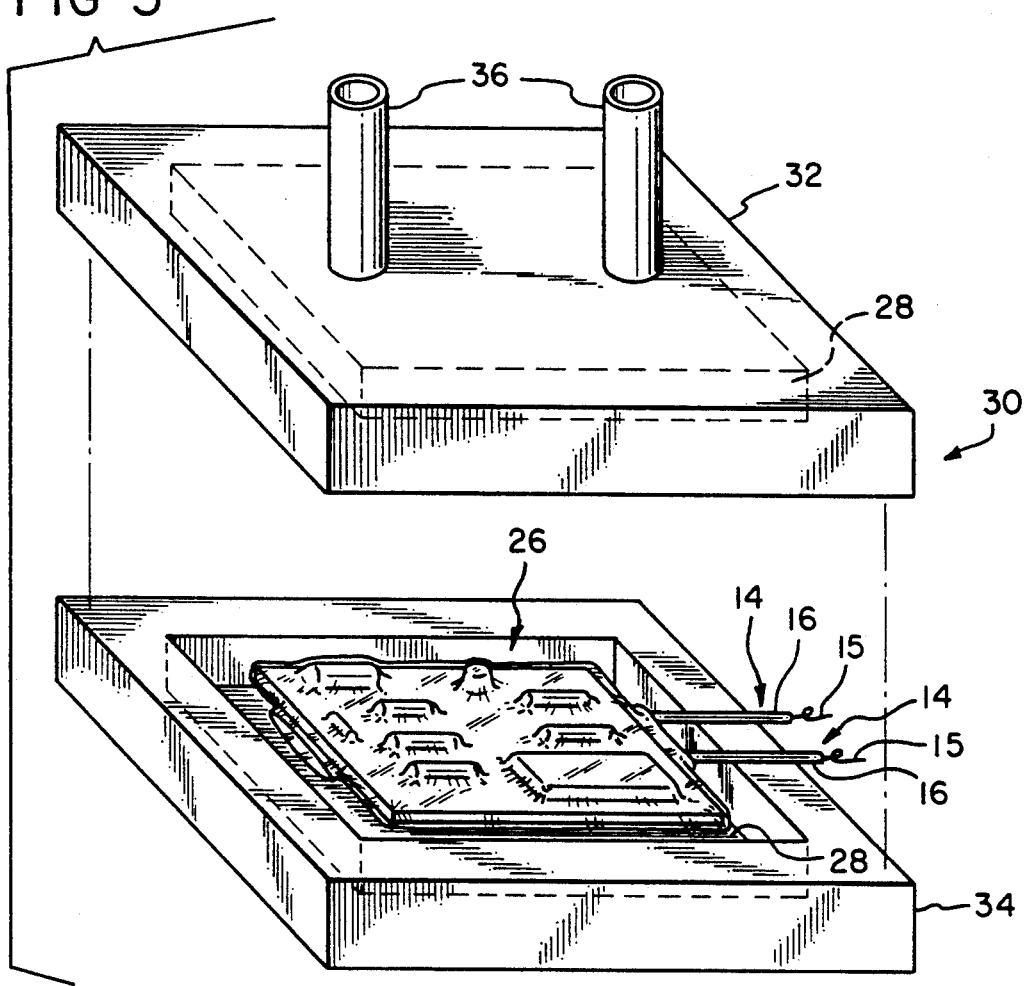
FIG. 5 is a perspective view of the encapsulated printed circuit board of FIG. 3 placed within an injection mold.

Referring now to FIG. 5, printed circuit board 10, encapsulated in encapsulating shell 26, is placed in cavity 28 of insert, injection mold 30. As shown, encapsulated printed circuit board 10 is placed in cavity 28 such that electrical contact leads 14 extend beyond the outer edges of mold 30. Although an insert, injection mold is presently illustrated, any type of mold can be utilized in accordance with the present invention. As is conventional, insert, injection mold 30 further includes upper mold half 32 and lower mold half 34. Positioned on upper mold half 32 are injection tubes 36, through which high temperature, high pressure flowable polymer is injected.

After placing printed circuit board 10, encapsulated in encapsulating shell 26, into cavity 28 of insert, injection mold 30, upper and lower mold halves 32 and 34, respectively, are tightly joined. High temperature flowable polymer is then injected at high pressure into cavity 28 through injection tubes 36. The polymer fills cavity 28 and substantially completely surrounds encapsulating shell 26, as well as the portions of electrical contact leads 14 which are exposed in cavity 28. Any type of polymer which becomes flowable upon heating can be utilized in accordance with the method of the present invention, such as, for example, polypropylene, acrylonitrile butadiene styrene, polyamides, or polycarbonates.

Advantageously, encapsulating shell 26 substantially prevents printed circuit board 10 from coming into contact with the injected polymer, thereby protecting the electronic components and solder joints from damage due to thermal shock or melting of the solder. Preferably, heat-shrinkable material 12 is a type which, after being heat shrunk to form encapsulating shell 26, has sufficient temperature resistance to be able to withstand contact by high-temperature, high-pressure injected polymer without decomposing. Specifically, the maximum operating temperature of the heat-shrinkable material used to encapsulate printed circuit board 10 should be higher than the temperature at which the flowable polymer is injected into mold 30. A preferred example of such a heat-shrinkable material is polytetrafluoroethylene. In addition to high temperature resistance, the heat-shrinkable material is preferably selected to be impervious to any fluids or other foreign materials which are expected to be present in the operating environment of the encapsulated product. In this manner, any such fluids or foreign materials which penetrate the outer plastic enclosure formed by the injected polymer will be substantially prevented from coming into contact with the enclosed object. For example, if the enclosed object is a speed sensor, the heat-shrinkable material forming the encapsulating shell therearound is preferably impervious to transmission fluid.

Figure 6:
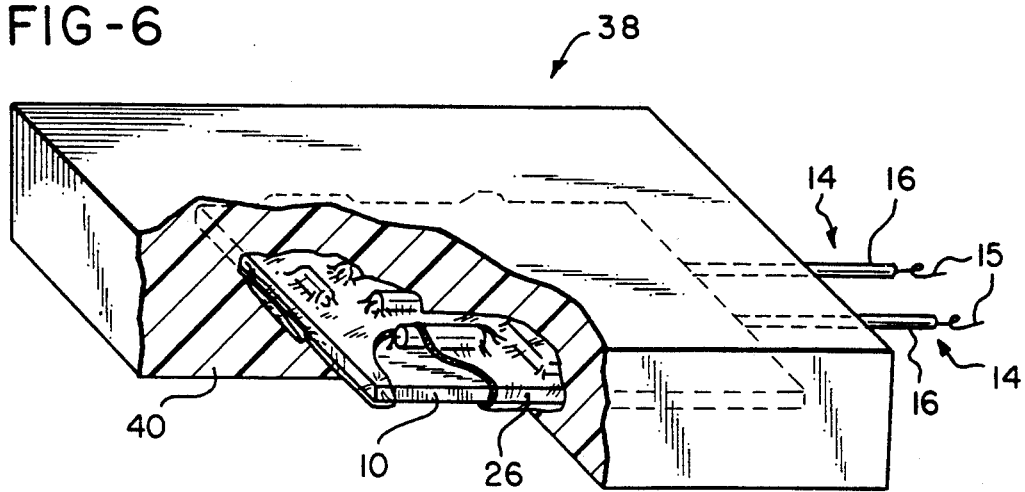
FIG. 6 is a perspective view, partially in section, of the encapsulated printed circuit board of FIG. 5 enclosed within a molded plastic material.

Referring now to FIG. 6, the encapsulated product 38 formed from the above-described method of the present invention is shown. Specifically, after polymer has been injected into mold 30 and made to solidify (e.g., by curing or cooling the polymer, as is conventional), encapsulated product 38 is removed from mold 30. As shown, encapsulated product 38 includes printed circuit board 10, which is substantially completely encapsulated by encapsulating shell 26. Encapsulating shell 26 is interposed between printed circuit board 10 and molded plastic material 40 such that molded plastic material 40 is substantially prevented from contacting printed circuit board 10. Molded plastic material 40 encloses printed circuit board 10 and encapsulating shell 26. Electrical contact leads 14 extend through encapsulating shell 26 and molded plastic material 40 such that electrical communication with printed circuit board 10 is possible even though it is encapsulated by encapsulated shell 26 and enclosed within molded plastic material 40.

Encapsulated product 38 can be positioned in any desired operating environment. Any object, whether electrical, electronic, or otherwise, can similarly be encapsulated prior to being insert, injection molded.

As described, encapsulating shell 26 protects printed circuit board 10 from exposure to flowable polymer during insert, injection molding, and from exposure to foreign liquid materials which may penetrate molded plastic material 40. By substantially completely encapsulating printed circuit board 10, encapsulating shell 26 greatly minimizes and substantially prevents contact with printed circuit board 10 by flowable polymer or foreign liquid materials by substantially reducing the surface exposure of printed circuit board 10. Further, openings 25 and 25' minimize direct contact with printed circuit board 10 by flowable polymer or foreign liquid materials due to the relatively small size of those openings. Only exposed portions 27 and 27' are directly exposed to flowable polymer or foreign liquid materials. Moreover, the tightly conforming shape of encapsulating shell 26 allows very little, if any, flowable polymer or foreign liquid materials to directly contact the remaining, non-exposed portions of printed circuit board 10.

While representative embodiments and certain details have been shown for purposes of illustrating the invention, it will be apparent to those skilled in the art that various changes in the methods and apparatus disclosed herein may be made without departing from the scope of the invention, which is defined in the appended claims.

What is claimed is:

1. An encapsulated product, comprising:
   an object enclosed within a molded plastic material; and
   an encapsulating shell positioned around said object and interposed between said object and said molded plastic material such that said molded plastic material is prevented from contacting said object, said encapsulating shell comprising a heat-shrinkable material which has been heat shrunk to encapsulate said object.

2. The product of claim 1 wherein said encapsulating shell conforms to the outer contour of said object such that no void spaces exist between said object and said encapsulating shell.

3. The product of claim 1 wherein said object comprises an electrical device and said product further includes means for electrically communicating with said electrical device.

4. The product of claim 3 wherein said electrical communication means comprises:
   a plurality of electrical contact leads attached to said electrical device, said electrical contact leads extending through said encapsulating shell and said molded plastic material; and
   at least one opening in said encapsulating shell through which said electrical contact leads extend, said opening being adapted to minimize contact with said electrical device by liquid materials which penetrate said molded plastic material.

5. The product of claim 1 wherein said object comprises an electronic device and said product further includes means for electrically communicating with said electronic device.

6. The product of claim 5 wherein said electrical communication means comprises:
   a plurality of electrical contact leads attached to said electronic device, said electrical contact leads extending through said encapsulating shell and said molded plastic material; and
   at least one opening in said encapsulating shell through which said electrical contact leads extend, said opening being adapted to minimize contact with said electronic device by liquid materials which penetrate said molded plastic material.

7. The product of claim 1 wherein said object comprises a printed circuit board and said product further includes means for electrically communicating with said printed circuit board.

8. The product of claim 7 wherein said electrical communication means comprises:
   a plurality of electrical contact leads attached to said printed circuit board, said electrical contact leads extending through said encapsulating shell and said molded plastic material; and
   at least one opening in said encapsulating shell through which said electrical contact leads extend, said opening being adapted to minimize contact with said printed circuit board by liquid materials which penetrate said molded plastic material.

9. The product of claim 1 wherein said encapsulating shell comprises polytetrafluoroethylene.

10. A method of making an encapsulated product, comprising the steps of:
    forming an encapsulating shell around an object, said encapsulating shell conforming to the outer contour of said object such that no void spaces exist between said object and said encapsulating shell;
    placing the encapsulated object in a mold having a cavity with a predetermined shape;
    adding a flowable polymer to said mold such that said encapsulated object is completely surrounded by said flowable polymer, said encapsulating shell minimizing contact with said object by said flowable polymer; and
    solidifying said flowable polymer.

11. The method of claim 10 wherein said step of forming an encapsulating shell includes the steps of:
    positioning a heat-shrinkable material around said object; and
    applying sufficient heat to said heat-shrinkable material to activate said heat-shrinkable material such that said heat-shrinkable material completely encapsulates said object.

12. The method of claim 11 wherein said heat-shrinkable material comprises polytetrafluoroethylene.

13. The method of claim 10 wherein said mold comprises an injection mold.

14. The method of claim 10 wherein said object comprises an electrical device having means for electrically communicating therewith.

15. The method of claim 14 wherein said electrical communication means includes a plurality of electrical contact leads attached to said electrical device, said electrical contact leads extending through said heat-shrinkable material and said flowable polymer.

16. The method of claim 10 wherein said object comprises an electronic device having means for electrically communicating therewith.

17. The method of claim 16 wherein said electrical communication means includes a plurality of electrical contact leads attached to said electronic device, said electrical contact leads extending through said heat-shrinkable material and said flowable polymer.

18. The method of claim 10 wherein said object comprises a printed circuit board having means for electrically communicating therewith.

19. The method of claim 18 wherein said electrical communication means includes a plurality of electrical contact leads attached to said printed circuit board, said electrical contact leads extending through said heat-shrinkable material and said flowable polymer.

20. A method of encasing an electrical or electronic device in a molded housing, said electrical or electronic device having a plurality of electrical contact leads attached thereto, said method comprising the steps of:
    positioning a heat-shrinkable material around said electrical or electronic device;
    applying sufficient heat to said heat-shrinkable material to activate said heat-shrinkable material such that said heat-shrinkable material forms an encapsulating shell around said electrical or electronic device, said encapsulating shell conforming to the outer contour of said electrical or electronic device such that no void spaces exist between said electrical or electronic device and said encapsulating shell, said heat-shrinkable material being positioned to form at least one opening in said encapsulating shell through which said electrical contact leads extend, said opening being adapted to minimize contact with said electrical device by materials which enter said opening;
    placing said encapsulated electrical or electronic device in a mold having a cavity with a predetermined shape;
    adding flowable polymer to said mold such that said encapsulated electrical or electronic device is substantially completely surrounded by said flowable polymer, said heat-shrinkable material substantially minimizing contact with said electrical or electronic device by said flowable polymer; and
    solidifying said flowable polymer.

* * * * *